(12) United States Patent
Lewis et al.

(10) Patent No.: US 10,191,666 B1
(45) Date of Patent: Jan. 29, 2019

(54) WRITE PARAMETER SWITCHING IN A MEMORY DEVICE

(71) Applicant: Adesto Technologies Corporation, Sunnyvale, CA (US)

(72) Inventors: Derric Jawaher Herman Lewis, Sunnyvale, CA (US); John Dinh, Dublin, CA (US); Nathan Gonzales, San Jose, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 14/875,464

(22) Filed: Oct. 5, 2015

Related U.S. Application Data

(60) Provisional application No. 62/209,476, filed on Aug. 25, 2015.

(51) Int. Cl.
*G06F 3/06* (2006.01)

(52) U.S. Cl.
CPC .......... *G06F 3/0613* (2013.01); *G06F 3/0659* (2013.01); *G06F 3/0688* (2013.01)

(58) Field of Classification Search
CPC .... G06F 3/0613; G06F 3/0659; G06F 3/0688; G06F 3/0611; G06F 3/0625; G06F 3/0658; G06F 3/0679
See application file for complete search history.

(56) References Cited

U.S. PATENT DOCUMENTS

| | | | | |
|---|---|---|---|---|
| 5,522,057 A | * | 5/1996 | Lichy | G06F 12/0822 711/142 |
| 5,713,006 A | * | 1/1998 | Shigeeda | G06F 1/1616 710/8 |
| 6,356,480 B1 | * | 3/2002 | Sakakibara | G11C 16/3404 365/185.22 |
| 7,349,243 B2 | | 3/2008 | Lin et al. | |
| 8,219,724 B1 | * | 7/2012 | Caruso | G06F 3/0604 710/36 |
| 8,659,954 B1 | | 2/2014 | Lewis et al. | |
| 8,908,407 B1 | * | 12/2014 | Haukness | G11C 15/046 365/49.1 |
| 8,995,167 B1 | * | 3/2015 | Kim | G11C 13/0069 365/148 |
| 9,047,948 B1 | | 6/2015 | Dinh et al. | |
| 9,099,176 B1 | * | 8/2015 | Buskirk | G11C 13/0002 |
| 2002/0036921 A1 | * | 3/2002 | Tamada | G11C 16/3454 365/185.09 |

(Continued)

*Primary Examiner* — Michael Krofcheck
(74) *Attorney, Agent, or Firm* — Michael C. Stephens, Jr.

(57) ABSTRACT

A method of controlling write parameter selection in a memory device, can include: (i) storing a configuration set number in a configuration register, where the configuration register is accessible by a user via an interface; (ii) receiving a write command from a host via the interface; (iii) comparing the stored configuration set number against set numbers in a register block to determine a match or a mismatch; (iv) downloading configuration bits from a memory array into the register block in response to the mismatch determination; (v) selecting a configuration set corresponding to the stored configuration set number from the register block in response to the match determination; and (vi) using the selected configuration set to perform a write operation on the memory device to execute the write command.

20 Claims, 8 Drawing Sheets

(56) References Cited

U.S. PATENT DOCUMENTS

| | | | | |
|---|---|---|---|---|
| 2003/0051192 | A1* | 3/2003 | Pillay | G01R 31/31701 714/39 |
| 2005/0281112 | A1* | 12/2005 | Ito | G11C 11/406 365/222 |
| 2008/0025078 | A1* | 1/2008 | Scheuerlein | G11C 5/02 365/163 |
| 2010/0054019 | A1* | 3/2010 | Toda | G11C 8/12 365/148 |
| 2011/0078538 | A1* | 3/2011 | Ikegawa | G11C 11/1675 714/758 |
| 2011/0131444 | A1* | 6/2011 | Buch | G11C 16/10 714/6.1 |
| 2011/0213921 | A1* | 9/2011 | Yu | G06F 3/061 711/103 |
| 2011/0258391 | A1* | 10/2011 | Atkisson | G06F 11/108 711/118 |
| 2014/0153310 | A1* | 6/2014 | Sekar | G11C 15/00 365/49.15 |
| 2014/0237205 | A1* | 8/2014 | Takefman | H03M 13/05 711/162 |
| 2015/0347896 | A1* | 12/2015 | Roy | G11C 11/16 365/148 |

* cited by examiner

WRITE PARAMETER SWITCHING IN A MEMORY DEVICE

RELATED APPLICATIONS

This application claims the benefit of U.S. Provisional Application No. 62/209,476, filed Aug. 25, 2015, and which is incorporated herein by reference in its entirety.

FIELD OF THE INVENTION

The present invention generally relates to the field of semiconductor devices. More specifically, embodiments of the present invention pertain to non-volatile memory (NVM) write operation control.

BACKGROUND

NVM is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive switching memory technologies that include resistive random-access memory (ReRAM) and conductive bridging RAM (CBRAM), may offer relatively lower power and higher speeds as compared to flash memory technologies. For example, CBRAM utilizes a conductive bridging cell technology, which has the potential to scale to smaller sizes than flash memory devices. In any event, write operation parameters can be utilized to set various aspects of a given write operation to the NVM device.

SUMMARY

In one embodiment, a method of controlling write parameter selection in a memory device, can include: (i) storing a configuration set number in a configuration register, where the configuration register is accessible by a user via an interface; (ii) receiving a write command from a host via the interface; (iii) comparing the stored configuration set number against set numbers in a register block to determine a match or a mismatch; (iv) downloading configuration bits from a memory array into the register block in response to the mismatch determination; (v) selecting a configuration set corresponding to the stored configuration set number from the register block in response to the match determination; and (vi) using the selected configuration set to perform a write operation on the memory device to execute the write command.

In one embodiment, a memory device can include: (i) a configuration register configured to store a configuration set number, where the configuration register is accessible by a user via an interface; (ii) a command decoder configured to receive a write command from a host via the interface; (iii) a register block having set numbers that are compared against the stored configuration set number to determine a match or a mismatch; (iv) a memory array configured to provide configuration bits to the register block in response to the mismatch determination, where a configuration set corresponding to the stored configuration set number is selected from the register block in response to the match determination; and (v) a controller configured to use the selected configuration set from the register block to perform a write operation on the memory device to execute the write command.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Example Memory Device Cell Structure, Architecture, and Interface

Particular embodiments may be directed to volatile or non-volatile memory (NVM), such as resistive switching memories (e.g., conductive bridging random-access memory [CBRAM], resistive RAM [ReRAM], etc.). The invention, in its various aspects, will be explained in greater detail below with regard to exemplary embodiments. Particular embodiments can include structures and methods of operating resistive switching memories that can be programmed/written and erased between one or more resistance and/or capacitive states. Resistive switching memory devices can include a plurality of resistive memory cells with "programmable impedance elements" or any type of resistive switching or resistance-change memory cells or elements.

Figure 1:
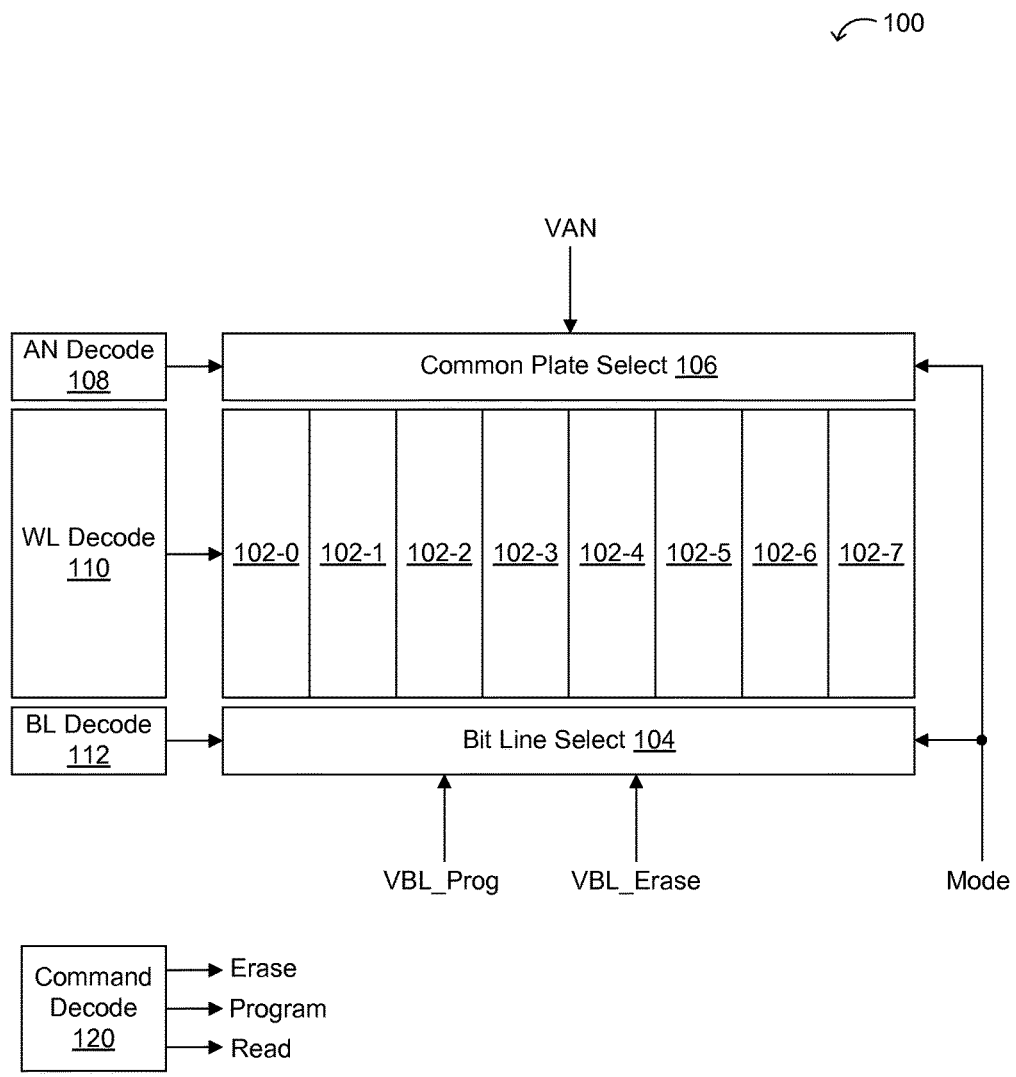
FIG. 1 is an example memory device arrangement, in accordance with embodiments of the present invention.
Figure 2:
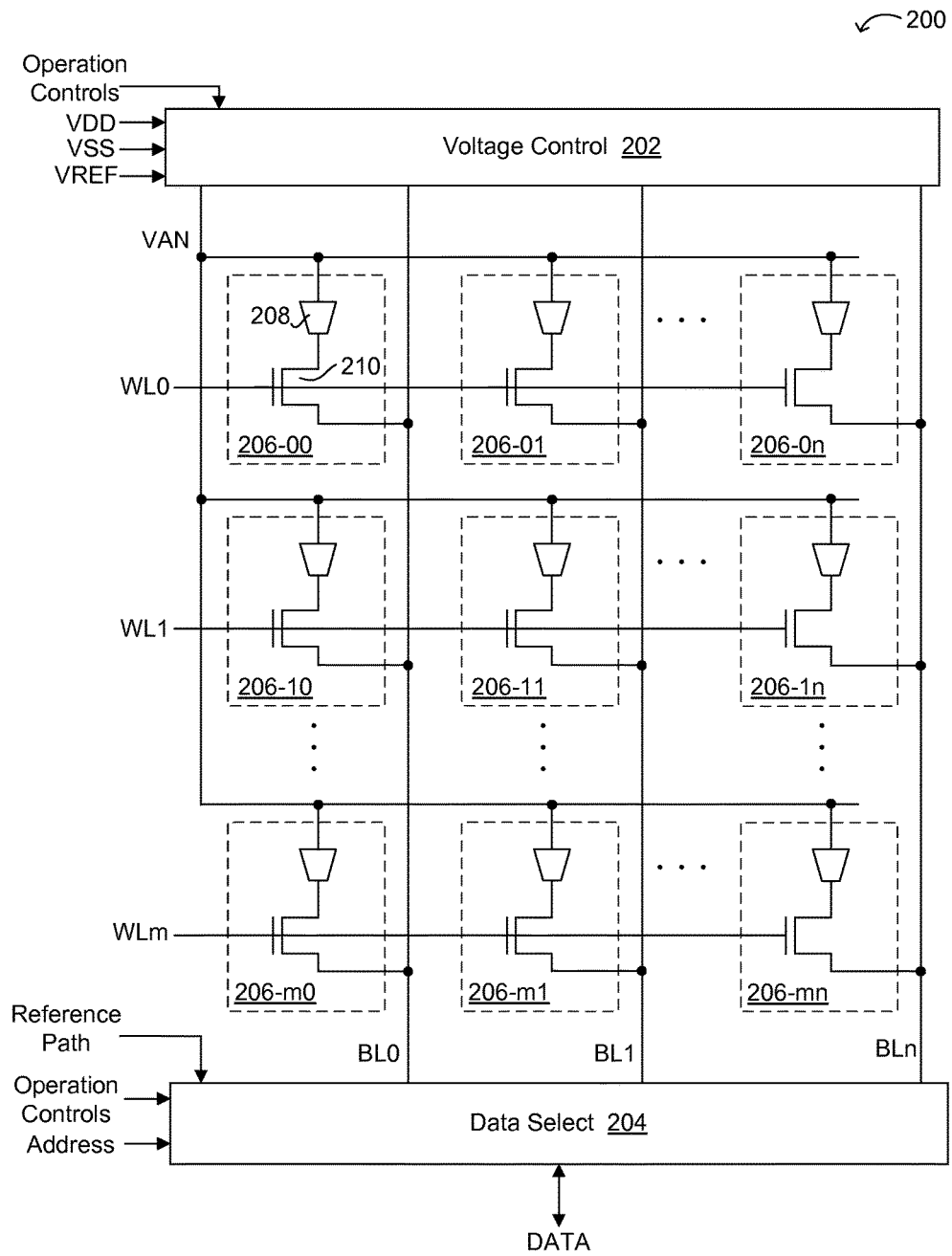
FIG. 2 is a schematic block diagram of an example common anode array structure, in accordance with embodiments of the present invention.

FIGS. 1 and 2 show example memory architectures and circuit structures that can utilize programmable impedance elements. However, particular embodiments are amenable to a wide variety of memory architectures, circuit structures, and types of resistive switching memories.

Referring now to FIG. 1, an example memory device is shown and designated by the general reference character 100. A memory device 100 can include common anode sectors 102-0 to 102-7, bit line selection circuitry 104, common plate selection circuitry 106, anode decoding circuitry 108, word line decoding circuitry 110, and bit line decoding circuitry 112. A memory device 100 can be a single integrated circuit, or may form a portion of a larger integrated circuit device that provides functions in addition to memory, such as in an "embedded" memory configuration.

FIG. 1 may also include command decoding circuitry 120. For example, command decoding circuitry 120 may receive external signals (e.g., from an interface), or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

Common anode sectors (102-0 to 102-7) can each include a number of memory cells arranged into one or more columns and multiple rows, and coupled to a common anode plate. Each memory cell can include one or more programmable impedance elements or CBRAM storage elements, and a selection device. Generally, a CBRAM storage element may be configured such that when a bias greater than a threshold voltage is applied across electrodes of the CBRAM storage element, the electrical properties of the CBRAM storage element can change. For example, in some arrangements, as a voltage is applied across the electrodes of the CBRAM storage element, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

Voltages VBL_Prog, VBL_Erase, and VAN may be conventional power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a CBRAM cell by applying suitable voltages across the electrodes thereof.

Bit line selection circuitry 104 can selectively connect bit lines of one or more common anode sections (102-0 to 102-7) according to a mode of operation and bit line decoding values. In one particular example, bit line selection circuitry 104 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Common plate selection circuitry 106, can connect anode plates to an inhibit voltage for CBRAM cells that are not selected (e.g., via anode decode 108) for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected CBRAM device can be switched between program and erase operations. In this way, program and erase can be "symmetric" operations. That is, in a programming operation, a CBRAM cell to be programmed can be connected between suitable voltages (e.g., V1-V2) in an anode-to-cathode direction. In an erase operation, a CBRAM cell to be erased can be connected between suitable voltages (e.g., V2-V1) in a cathode-to-anode direction.

Bit line decoding circuitry 112 can generate values for selecting given bit lines for read, program, and erase operations. In one arrangement, in response to address information (e.g., column address data), bit line decoding circuitry 112 can generate bit line select signals for application to bit line select circuitry 104. Word line decoding circuitry 110 can generate values for selecting a given set of memory cells by enabling access devices in one or more selected rows of common anode sections (102-0 to 102-7). In response to address information (e.g., row address data), one or more word lines can be driven to a select voltage to thereby enable the corresponding select device (e.g., a transistor) in a row of memory cells.

Referring now to FIG. 2, shown is a schematic block diagram of an example common anode array structure 200, which can be one implementation of the example shown in FIG. 1. In this example, voltage control 202 can receive various supply voltages (e.g., VDD, VSS, VREF, etc.), as well as operation controls (e.g., program, erase, verify, read, etc.). Resistive memory cells 206 can include a programmable impedance element 208 and an access transistor 210, as shown. In this particular arrangement, the anode of each memory cell 206 can connect together in a common anode structure. For example, the common anode can be a large plate structure that may be biased at a voltage VAN generated by voltage control 202. Of course, other voltage generation control and regulated levels, as discussed above, can be utilized in certain embodiments.

In this example, data select 204 can provide an interface between the bit lines (BL0, BL1, . . . BLn) and a data path that is coupled to a sensing or amplification block, as well as to write circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed and decoded. In addition, word line (WL0, WL1, . . . WLm) decoding can be utilized for activation of the appropriate word line for a given cycle.

Further, a reference path can also be coupled to data select 204. The reference path can be used by a sensing circuit in order to compare against a regular bit line. For example, a current from a selected bit line and its selected memory cell 206 can be compared against a current from a reference bit line, where the reference bit line is biased such that appropriate data states on the selected memory cell via the selected bit line can be detected. In one application, the capacitance on the reference bit line and reference memory cell structure can match the capacitance on a regular memory cell/bit line such that these effects are negated during the sensing process.

Other architectures can also be employed with sensing circuitry, arrangements, and methods of particular embodiments. For example, a common cathode structure, whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is a strapped source structure. In any event, particular embodiments are suitable to a wide variety of resistive memory cell architectures and arrangements.

Data select 204 can also receive operation control signals. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. For example, a common bidirectional sensing circuit can be employed in each of these operations. In particular, the bidirectional sensing circuit can allow for a program verify to be performed using a same forward bias (anode voltage higher with respect to cathode voltage) on the memory cell as was used to program the memory cell. Similarly, the bidirectional sensing circuit can allow for an erase verify to be performed using a same reverse bias (cathode voltage higher with respect to anode voltage) on the memory cell as was used to erase the memory cell.

Sensing circuits in particular embodiments also aim to minimize disturbance of the accessed cell resistance during the read operation to determine a data state from that cell. Thus, a cell that is programmed (e.g., in a data state "0") should remain in that state after a program verify or standard read operation, and a cell that is erased (e.g., in a data state "1") should remain in that state after an erase verify or standard read operation. The CBRAM cell may generally be programmed with a forward bias voltage (positive with respect to anode and cathode), and may be erased with a reverse bias voltage (negative with respect to anode and cathode). Various voltages for bit lines and the common anode plate can be supported in particular embodiments. Voltages can also be changed depending on the bias direction (forward or reverse) for a read operation.

Having described the various sections of FIG. 2, one example of the operation of such a memory device will now be described with reference to an operation that accesses memory cell 206-00. Initially, word lines WL0, WL1, . . . WLm can be driven to a de-select voltage (e.g., low) by associated word line drivers. Bit line selection circuitry 104 can place bit lines BL0 and BL1 in the de-selected state. Similarly, common plate selection circuitry 106 can place common anode plates in the de-select state.

In a program operation, in response to address and mode data, bit line selection signals can be used to connect a selected bit line to read/write control circuitry via data select 204. In contrast, other bit lines can be de-selected, and thus placed in the de-selected state. Mode selection values can result in read/write control circuitry connecting the selected bit line (e.g., BL0) to a cathode program voltage. A program operation can also include anode plate voltage VAN being connected to a program voltage, while connecting the selected bit line is grounded. A word line driver corresponding to the selected memory cell can be driven to a select voltage, thereby placing the selected memory cell between suitable programming voltages.

An erase operation can occur in the same general fashion, but with the erase voltage being applied to the selected bit line and common anode voltage VAN. As noted in the example of FIG. 1, in particular embodiments, such an operation can be symmetrical. Also, while FIG. 2 shows n-channel MOS transistors 210 as access devices, other embodiments may include different types of access devices. In such alternate embodiments, associated word line drivers would provide appropriate voltage and/or currents to enable such access devices. In this way, bit line selection, anode plate selection, and word line activation can be utilized to program and/or erase a CBRAM array having bit lines connected to cathodes of CBRAMs within multiple memory cells.

While particular example architectures and circuits suitable for CBRAMs, and memory arrays formed thereof, with respect to FIGS. 1 and 2, programmable impedance elements in certain embodiments are suitable to a wide variety of architectures and/or circuit arrangements.

Figure 3:
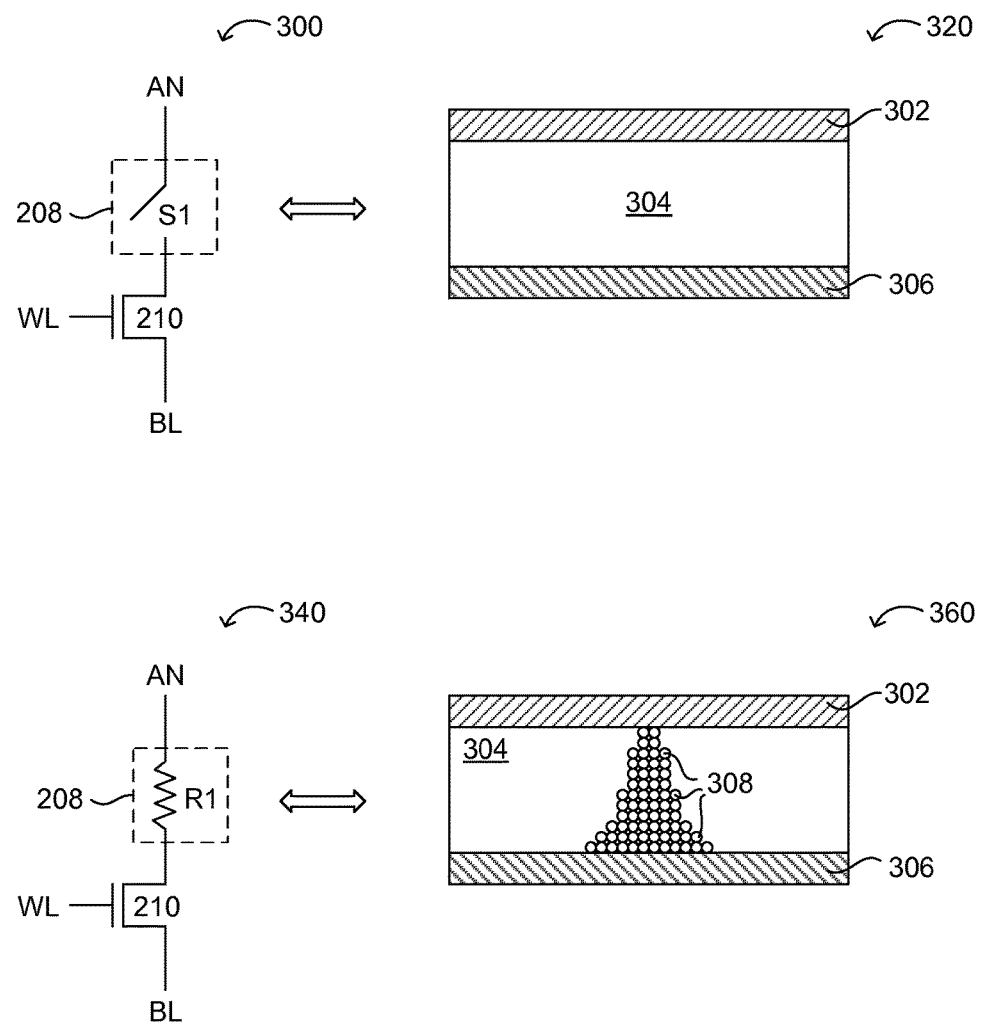
FIG. 3 is a diagram of an example programmable impedance element with schematic modeling, in accordance with embodiments of the present invention.

Referring now to FIG. 3, shown is a diagram of an example programmable impedance element with schematic modeling. For example, example 300 shows a memory cell with an open switch S1 representation of programmable impedance element 208. The programmable impedance element or CBRAM storage element portion of this representation corresponds to the cross-section diagram 320, which represents a resistive storage element in a high impedance state (e.g., data state "1"), or an erased state. Particular embodiments can also include any type of resistive switching or resistance-change memory cells or elements. In one example, CBRAM storage element 320 can include electrochemically active electrode 302, solid electrolyte 304, and inert electrode 306. The example CBRAM storage element 320 may represent a strong or substantially erased state of the cell. As shown, substantially no conductive path between active electrode 302 and inert electrode 306 is seen in CBRAM storage element 320.

Schematic representation 340 and corresponding cross-section diagram 360 show examples of CBRAM storage element 208 in a low impedance state (e.g., data state "0"), or a programmed state. For example, example 340 shows a memory cell with a resistor R1 or closed switch representation of CBRAM storage element 208. The CBRAM storage element portion of this representation corresponds to the cross-section diagram 360. In the example 360, electrodeposits 308 can form in solid electrolyte 304 to form a "bridge" or conductive path between electrochemically active electrode 302 and inert electrode 306 to program the memory cell. For example, electrodeposits 308 can be from active electrode 302, and may include silver, copper, titanium, or tellurium, as just a few examples. As shown in example CBRAM storage element 360, a full conductive path may be formed between active electrode 302 and inert electrode 306 by electrodeposits 308.

As shown in examples 300 and 340, a control transistor (e.g., 210) can also be included in each memory cell including the programmable impedance element or CBRAM storage element 208. For example, transistor 210 can be controlled by a word line, as discussed above with respect to FIG. 2. Transistor 210 may be an access transistor to allow CBRAM storage element 208 to be programmed, read, and erased.

Cell data can be erased in similar fashion to cell programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a CBRAM storage element may be substantially symmetric to a program operation. Also, the particular values of write operation biases, pulse widths, etc., can be based on various configuration settings, as will be discussed in more detail below.

Figure 4:
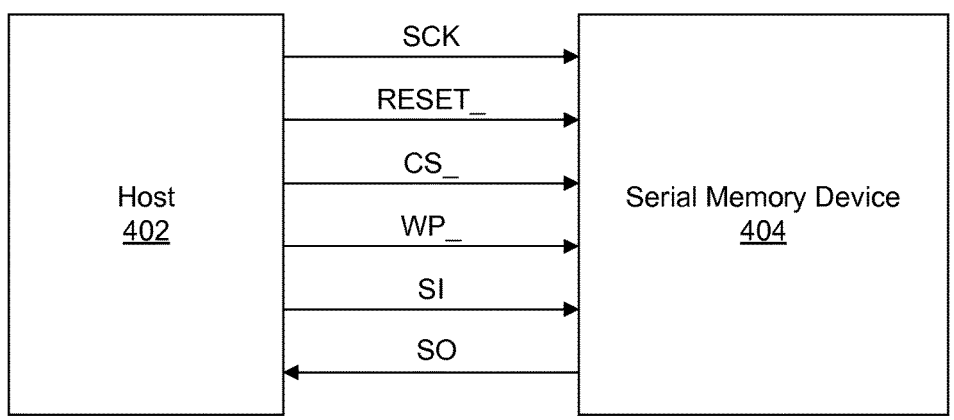
FIG. 4 is a schematic block diagram of an example host and serial memory device arrangement, in accordance with embodiments of the present invention.

Referring now to FIG. 4, shown is a schematic block diagram 400 of an example host and serial memory device arrangement, in accordance with embodiments of the present invention. In this example, host 402 can interface with serial memory device 404 via a serial interface. For example, host 402 can be any suitable controller (e.g., CPU, MCU, general-purpose processor, etc.), and serial memory device 404 can be any type of memory device (e.g., SRAM, DRAM, EEPROM, Flash, CBRAM, magnetic RAM, ReRAM, etc.). Serial memory device 404 can thus be implemented in a variety of memory technologies, such as non-volatile types. In some cases, serial memory device 404 can be a serial flash memory that may be implemented in more traditional non-volatile memories, or in CBRAM/ReRAM resistive switching memories.

Various interface signals, such as in a serial peripheral interface (SPI) interface, can be included for communication between host 402 and serial memory device 404. For example, serial clock (SCK) can provide a clock to device 404, and may be used to control the flow of data to and from the device. Command, address, and input data (e.g., on the SI pin) can be latched on a rising edge of SCK, while output data (e.g., on the SO pin) can be clocked out on a falling edge of SCK. The reset pin (RESET_) can be used to terminate an operation in progress, and to reset an internal state machine of serial memory device 404 (e.g., to an idle state). Serial memory device 404 can remain in the reset condition as long as a low level is present on the reset pin. Also, because serial memory device 404 can include power-on reset circuitry, there may be no restrictions on the reset pin during power-on sequences. In some other implementations, memory device 404 may not include a reset pin (RESET_), and may instead include a hold pin (HOLD_).

Chip select (CS_) can be utilized to select serial memory device 404, such as from among a plurality of such memory devices, or otherwise as a way to access the device. When the chip select signal is de-asserted (e.g., at a high level), serial memory device 404 will also be deselected, and may be placed in a standby mode. Activating the chip select signal (e.g., via a high to low transition on CS_) may be utilized to start an operation, and returning the chip select signal to a high state can be utilized for terminating an operation. For internally self-timed operations (e.g., a program or erase cycle), serial memory device 404 may not enter standby mode until completion of the particular ongoing operation if chip select is de-asserted during the operation.

Write protect (WP_) can be utilized for protection of sectors specified for protection by a register (e.g., the sector protection register). For example, such sectors may be protected against program and erase operations. Thus, if a program or erase command is issued to serial memory device 404 while the write protect pin is asserted, the device may ignore the command and perform no operation.

In the example SPI interface, data can be provided to serial memory device 404 via a serial input (SI) signal. This interface can be utilized for providing commands to the memory device, receiving data from the memory device, and for accessing a user accessible configuration register in the memory device, to name just a few examples. The serial input can be utilized for data input including command and address sequences. For example, data on the serial input pin can be latched on a rising edge of SCK, and data on the serial input pin can be ignored if the device is deselected (e.g., when the chip select signal is de-asserted). Data can be output from serial memory device 404 via a serial output (SO) signal. For example, data on the serial output can be clocked out on a falling edge of SCK, and the serial output signal can be in a high impedance state when the device is deselected (e.g., when the chip select signal is de-asserted).

Figure 5:
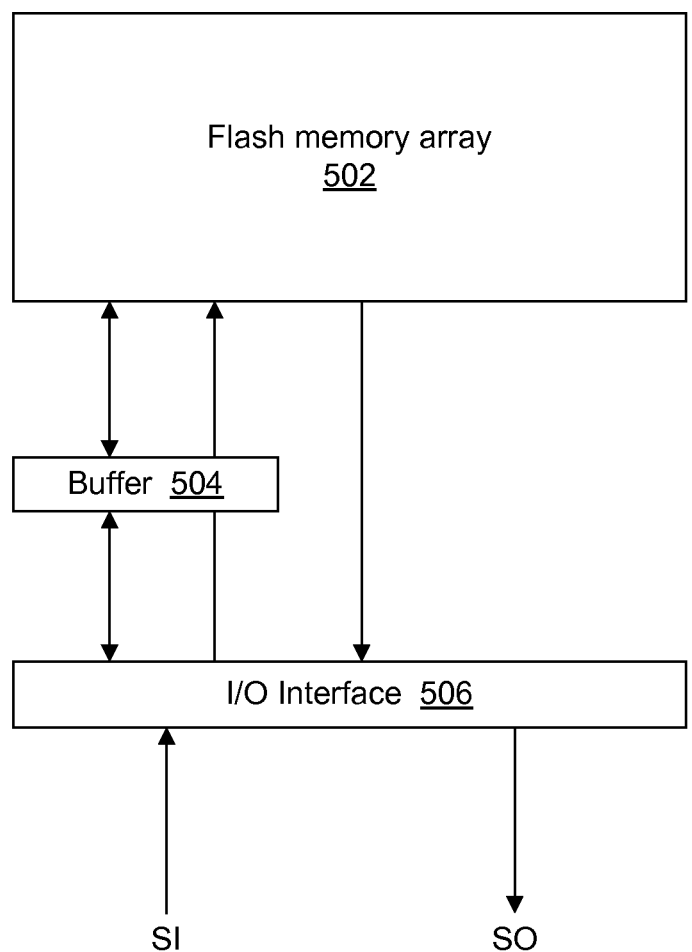
FIG. 5 is a schematic block diagram of an example serial memory device structure, in accordance with embodiments of the present invention.

Referring now to FIG. 5, shown is a schematic block diagram of an example serial memory device 404 structure, in accordance with embodiments of the present invention. For example, serial memory device 404 can include flash memory array 502, buffer 504, and I/O interface 506. In some arrangements, more than one buffer 504 can be provided, such as a buffer for an input path, and another buffer for an output path. Alternatively, or in addition, multiple buffers can be provided for multi-layer buffering. Serial memory device 404 can be configured as a data flash and/or a serial flash device. Flash memory array 502 can be organized as any suitable number of pages of data. For example, the each page can include 256 or 264 bytes of data. Similarly, buffer 504 can store a page of data. Also, I/O interface 506 can provide interfacing between flash memory array 502, buffer 504, and serial data input (SI) and output (SO). For example, I/O interface 506 may be part of an SPI or other serial type of interface.

Example Write Parameter Selection Control in a Memory Device

Memory devices may be configured for optimal operation in a "user mode," which can include various parameter settings that are optimized for given write (e.g., program or erase) operations. For example, one set (configuration set) of write parameters can be a used for an application of writing code to the NVM device with a requirement that the device retains this information through a surface-mount technology (SMT) process, or other type of high temperature process. Another configuration set of write parameters can be optimized for an application of writing data to the memory device with certain retention requirements, such as 10 years and 85° C. Another configuration set of write parameters can be optimized for an application of writing data to the memory device with relaxed retention requirements, but with relatively fast write times. Any number of predetermined configuration sets can be defined in a memory device.

These different write use models can thus require different program/erase parameters, but manufactures typically select one single set of parameters which aims to cover all such user or other requirements. However, this approach can result in conditions that are not optimal for a specific use model, and which can effectively compromise the functionality of the NVM device in favor of design simplicity. In certain embodiments, a "CAM block" (e.g., a fuse block) or other register block structure (e.g., 702 in FIG. 7) can be used to store the program/erase configuration bits (as part of a configuration set) for write operations. In this approach, in order to support multiple different sets of write parameter configurations, the number of CAM (fuse) bits can be proportionately increased. However, depending on the type of register block structure (e.g., fuse bits), these CAM bits may be relatively expensive in terms of die area.

In particular embodiments, an increase in the number of CAM bits can be avoided by using the memory array (e.g., 712 in FIG. 7) itself to store the different program/erase configuration sets, and then to download them from the memory array into the CAM/register bits on demand. In another approach of particular embodiments, an internal test mode of the memory device can be exposed to the user (e.g., customer, programmer, manufacturer, etc.), with instructions as to writing directly into the CAM/register block, thereby changing the program/erase configuration bits. However, this approach may give rise to possible security concerns as to exposing the internal circuits of the device.

In certain embodiments, a user accessible configuration register (e.g., 718 in FIG. 7) can be added to allow the user to choose from, e.g., 1 of N different predetermined write configuration settings. When the user issues a write command via the interface to the NVM device, the controller (e.g., a write operation controller) can compare configuration set numbers in the CAM block against the number that is stored (e.g., as a result of previous programming) in the user accessible configuration register. If there is no match, then the desired configuration bits can be downloaded from the memory array into the CAM/register block to support the desired configuration set for the write operation. However, if there is a match, then the desired configuration bits can be directly selected from the CAM/register block. In any event, once the CAM/register block is loaded with the correct program/erase configuration set for the given use case, then the internal write operation may begin by using such optimized write parameters.

Once the internal write operation is completed, the NVM device can then either keep the CAM block as is (in a same state), or restore the CAM/register block back to its original (or default), or previous program/erase configuration settings. Whether the CAM/register block (e.g., 702) returns to its default state after the write operation, or maintains the updated settings as is, can also be controlled by bits (e.g., a flag) in the user accessible configuration register. In this way, the memory device can support optimized write parameter selection for any number of configurations, such as for code writing that needs to survive SMT, for data writing that needs long retention, or for data writing that needs relatively fast write times, to name a few configuration set options. The user can then arbitrarily switch between these three configuration sets by way of the configuration register, for any given write operation, and such as depending on the particular use case or application of the memory device.

In one embodiment, a method of controlling write parameter selection in a memory device, can include: (i) storing a configuration set number in a configuration register, where the configuration register is accessible by a user via an interface; (ii) receiving a write command from a host via the interface; (iii) comparing the stored configuration set number against set numbers in a register block to determine a match or a mismatch; (iv) downloading configuration bits from a memory array into the register block in response to the mismatch determination; (v) selecting a configuration set corresponding to the stored configuration set number from the register block in response to the match determination; and (vi) using the selected configuration set to perform a write operation on the memory device to execute the write command.

Figure 6:
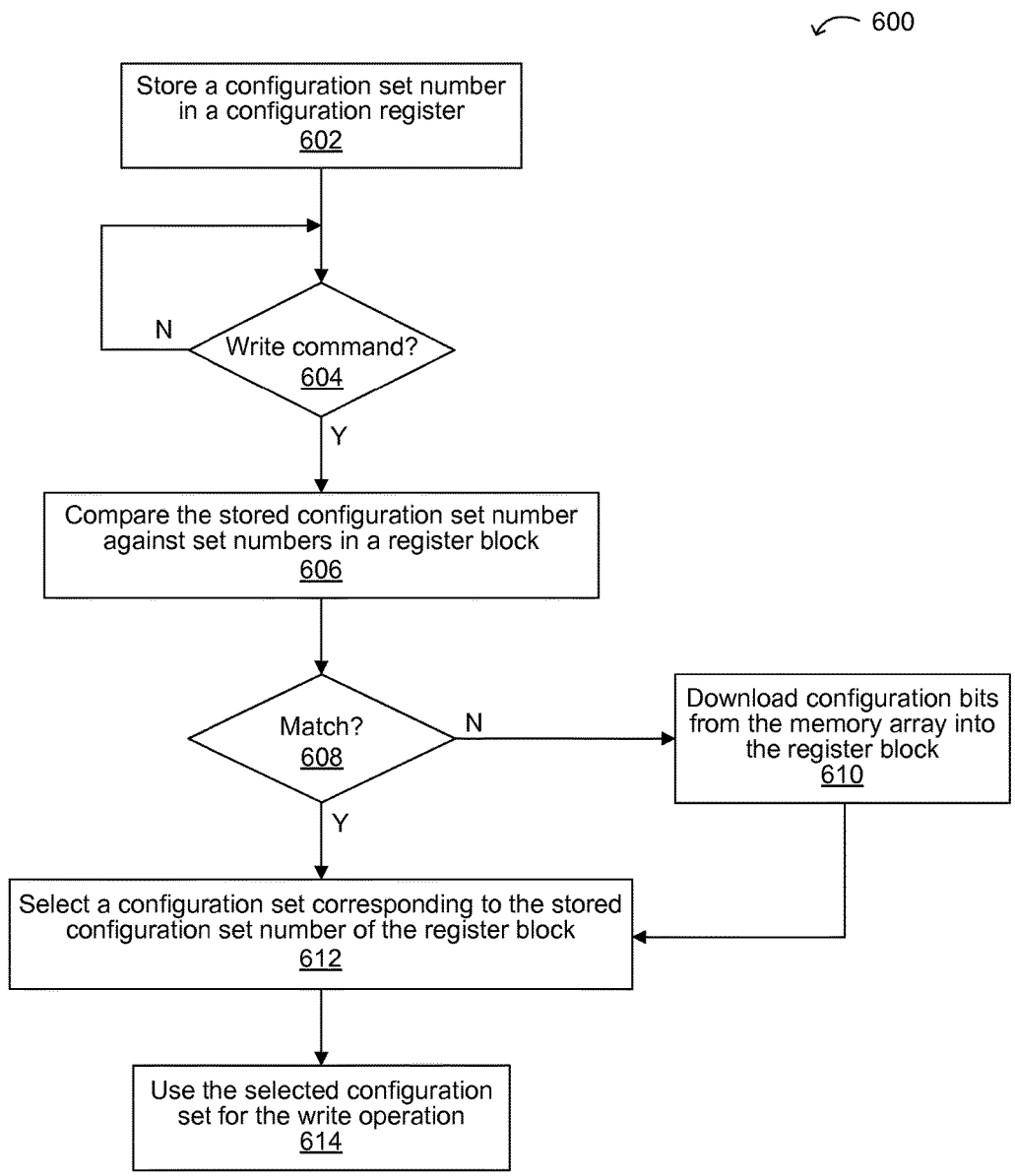
FIG. 6 is a flow diagram of an example method of selecting write parameters in a memory device, in accordance with embodiments of the present invention.

Referring now to FIG. 6, shown is a flow diagram 600 of an example method of selecting write operation parameters in a memory device, in accordance with embodiments of the present invention. At 602, a configuration set number can be stored in a user accessible configuration register (e.g., 718). If a write command is received at 604, at 606 the stored configuration set number (e.g., from the configuration register) can be compared against set numbers in a register block (e.g., CAM/register block 702). If there is no match at 608, at 610 the configuration bits can be downloaded from the memory array (e.g., a designated portion thereof) into the CAM/register block. If there is a match at 608, at 612 the configuration set corresponding to the stored configuration set number of the CAM/register block can be selected. In any event, at 614 the selected configuration set can be utilized by the write controller (e.g., one or more of controllers 704, 706, and 708) for performing the write operation on the memory device.

As used herein, a "configuration set" can be a set of parameters and/or option variables that may be part of a particular algorithm for executing a write operation. The parameters can include any of pulse widths, voltage values (e.g., across the memory storage element electrodes), current settings, etc., and may include any parametric values utilized in configuring the memory device to perform the given program or erase operation. Also, a "configuration set number" can be a binary string that corresponds to or otherwise identifies (e.g., via addressing) a particular predetermined configuration set. For example, the configuration sets can each be represented by binary values that can be stored in register block 702.

In one embodiment, a memory device can include: (i) a configuration register configured to store a configuration set number, where the configuration register is accessible by a user via an interface; (ii) a command decoder configured to receive a write command from a host via the interface; (iii) a register block having set numbers that are compared against the stored configuration set number to determine a match or a mismatch; (iv) a memory array configured to provide configuration bits to the register block in response to the mismatch determination, where a configuration set corresponding to the stored configuration set number is selected from the register block in response to the match determination; and (v) a controller configured to use the selected configuration set from the register block to perform a write operation on the memory device to execute the write command.

Figure 7:
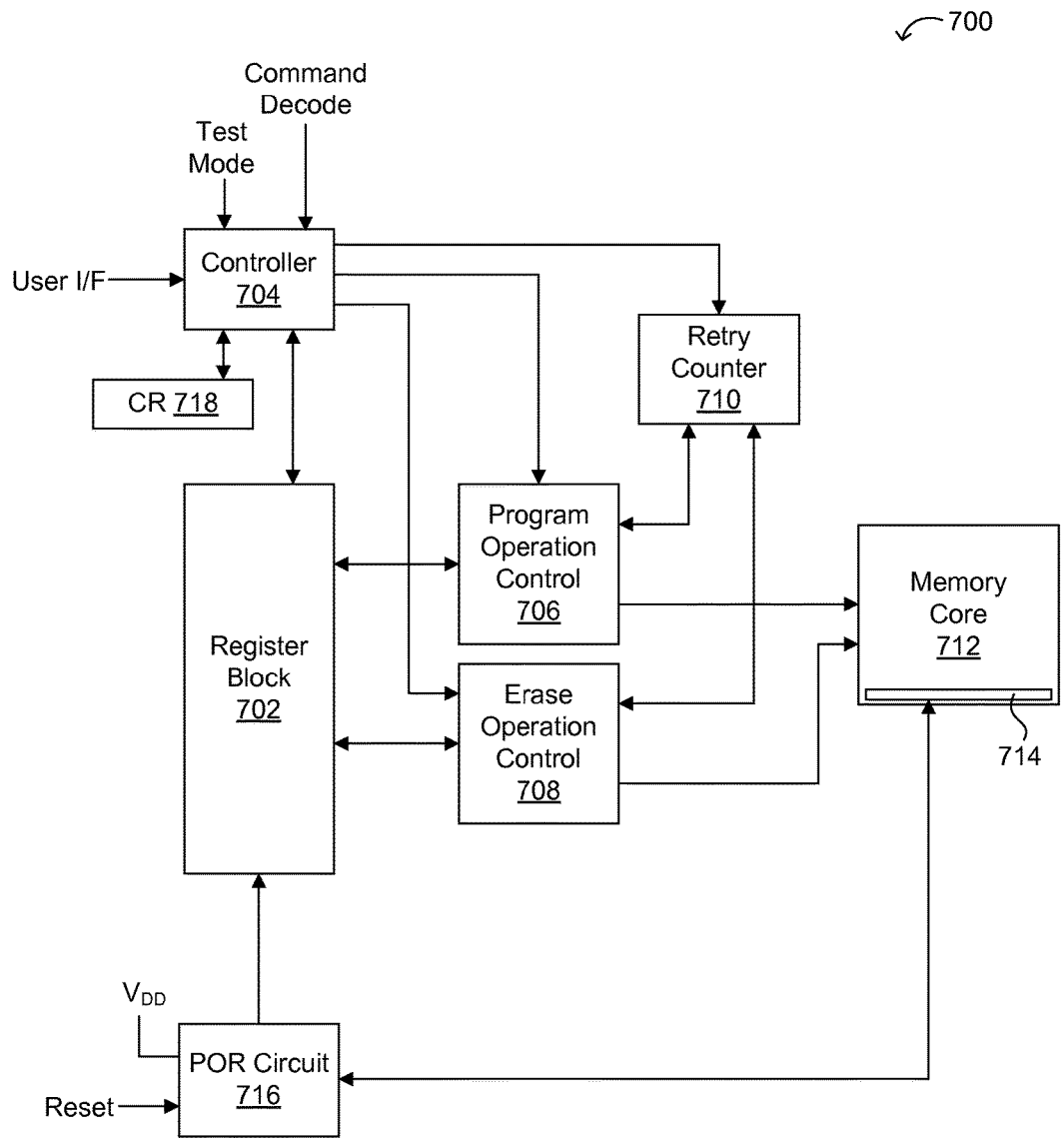
FIG. 7 is a schematic block diagram of an example register and operation control, in accordance with embodiments of the present invention.

Referring now to FIG. 7, shown is a schematic block diagram 700 of an example register and operation control, in accordance with embodiments of the present invention. For example, register block 702 can be implemented using SRAM, or in some cases fuse bits. Register block 702 can provide parameter, algorithm, and/or option variable selections in the form of configuration sets to program operation control 706 and erase operation control 708. Controller 704 may determine and decode the received command, and can also control access to the register bits in register block 702, such as for providing to write operation controllers 706 and 708. In addition, test modes (e.g., to determine operation distribution, etc.) can be used to override data in register block 702. Settings for register block 702 may be based on various default algorithm and option variable or condition settings, but can also be programmed on lot-by-lot or device-by-device basis. Also, values for program operations, erase operations, and option variable or related condition settings, can be independently programmed in register block 702.

Power-on reset (POR) circuitry or state machine 716, which can receive a reset signal (e.g., via the RESET_ pin), can access designated register data portion 714 and read out data from that dedicated section of memory array 712. Designated register data portion 714 may alternatively be located outside of memory core 712. In any event, this accessed data that is associated with memory core 712 may then be loaded into register block 702. In this way, information specific to this device can be programmed into the memory core, and whenever the device is powered on (e.g., as detected by $V_{DD}$ supply) or otherwise reset, this data can be loaded into register block 702. This is because the memory core, including designated register data portion 714 may include non-volatile memory. Also, different applications-based information can be stored in non-volatile memory designated register data portion 714. Further, different parts or memory cores 712 can be independently programmed (e.g., for different applications, etc.). In some cases, this dedicated portion of memory may not be accessible to the user. However, some applications may allow access to these designated locations, such as in a test mode.

In one or more test modes, controller 704 can override one or more values stored in register block 702. When the test mode is complete, data in register block 702 can revert to the data that was previously stored in the register. For example, registers 702 may be implemented as two storage bits per register cell, one such bit representing an override value that is only enabled during predetermined modes (e.g., test mode, etc.), and another bit storing the data programmed outside of the test mode (e.g., during normal operation, power up, etc.). As another example, registers 702 may be implemented as a single bit per cell or stored data bit, and data can be reverted to its previous state by accessing designated register data portion 714 and asserting the reset signal upon completion of the test mode.

In addition, registers 702 may be programmable by controller 704 and/or by a user via a separate or combined user interface. In this way, a user may be able to program data into registers 702 in order to override or change previous values therein. Particular embodiments may also support independently controlled program/erase algorithm selection for different memory cores 712. For example, controller 404 can set the register values in 702 different for different memory cores 712. For example, register block 702 may include dedicated sectors (e.g., a widened register or increased register bit length) for each memory core, or register block 702 may be replicated for each memory core 712. This may be utilized whereby one memory array 712 is dedicated to one application (e.g., code), while another memory array 712 may be dedicated to another application (e.g., data). In this way, register block 702 may accommodate independently programmable operation algorithms in support of different operations for different memory cores 712. Further, the dedicated sectors in this case can each have their own status register with a corresponding ready bit to indicate if that sector of the memory device is busy with an operation, or in a power down state.

Various program/erase operation algorithms, as well as status, information can be stored in register block 702. For example, at least two bits can be used to indicate which of a predefined group of program algorithms is to be used to execute a program command. Similarly, at least two bits in register block 702 can be used to indicate which of a predefined group of erase algorithms is to be used to execute an erase command. Further, option variables that define conditions (e.g., pulse widths, voltage levels, current levels, etc.) for the program and erase operations of the selected operation algorithm may also be defined in register block 702. In addition, a maximum number of retry attempts, which may be embedded within one or more of the program/erase algorithms may also be stored in register block 702. For example, retry counter 710 may keep track of a number of attempts for a given program or erase operation, or a sequence of program and/or erase operations, as part of a selected program/erase operation algorithm.

Particular embodiments may also support dynamically changing the operation algorithm as the semiconductor device ages, or arrays thereof are cycled more and more. For example, counters may be used to move to different algorithm and/or option variable selections and effectively change the program/erase algorithms to be used based on the counter results. In one example, designated register data portion 714 can be updated to reflect changed algorithm selections, option variables, etc., values based on such counter results. As a result, register block 702 can be updated via POR circuit 716, as discussed above. In another example, incremented values based on the counter results can be dynamically determined based on data output from register block 702. In this case, data that is read from register block 702 can then be updated by subsequent circuitry based on the counter results, before being provided as outputs to program operation control 706 and erase operation control 708.

In addition, configuration register (CR) 718 can be included with an interface to controller 704. As discussed above, configuration register 718 can be user accessible in order to indicate a desired configuration set that is optimized for the given application of the memory (e.g., NVM) device. Upon receiving a write command (e.g., via an external interface), controller 704 can compare (e.g., on a bit-by-bit basis) the contents of configuration register 718 against corresponding values in CAM/register block 702. If there is no match, designated register data portion 714, or another such portion of memory core 712, can be accessed to download the appropriate configuration bits into register block 702. However, if there is a match, indicating that the desired configuration set already resides in register block 702, the configuration bits can be accessed (e.g., by controller 704) directly from register block 702. In any event, program operation control 706 or erase operation control 708 (e.g., in conjunction with controller 704) can access the appropriate configuration bits from register block 702 in order to optimize the write operation for the given application or use case of the memory device.

Figure 8:
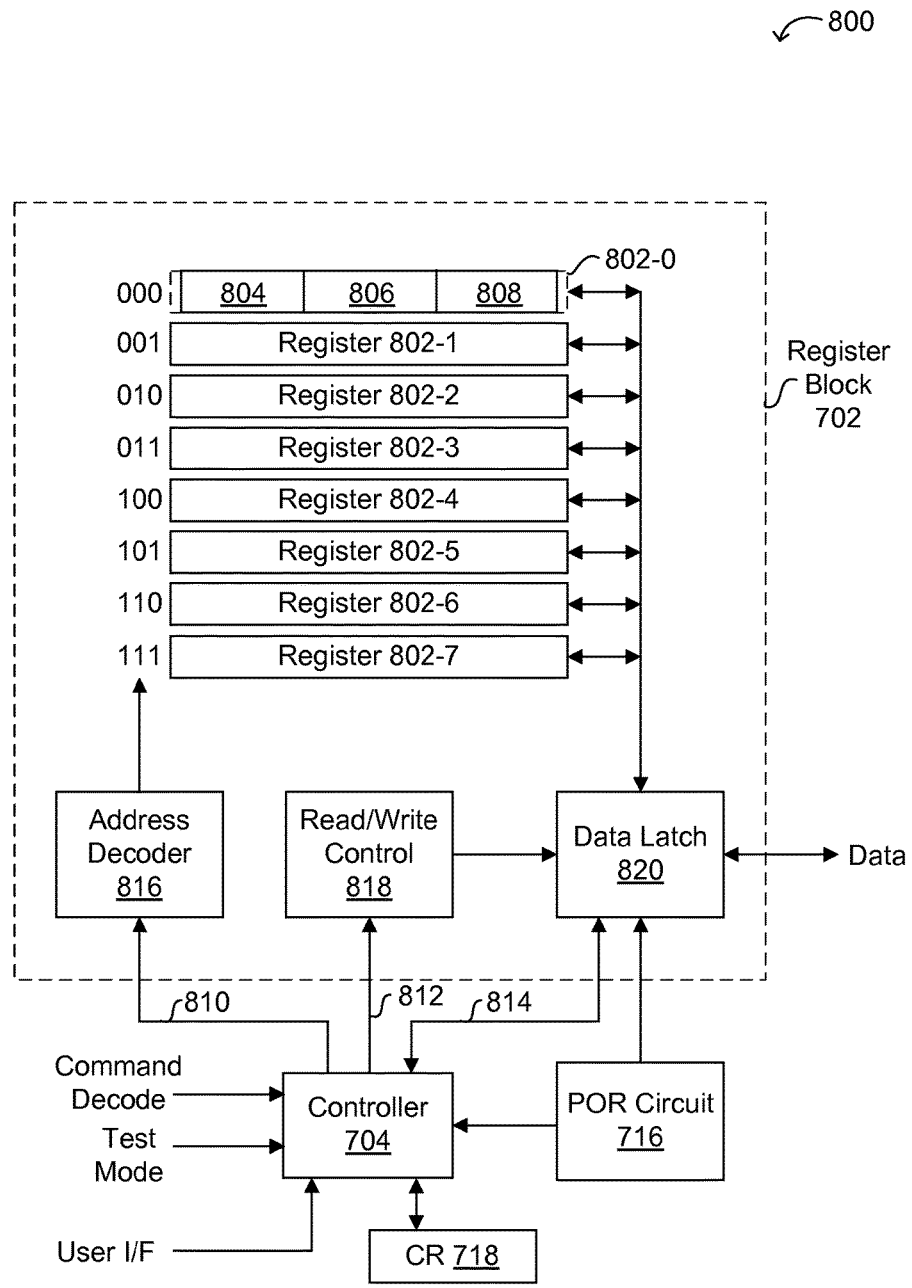
FIG. 8 is a schematic block diagram of an example register structure, in accordance with embodiments of the present invention.

Referring now to FIG. 8, shown is a schematic block diagram 800 of an example register structure, in accordance with embodiments of the present invention. In this example, register block 702 can include eight registers 802 (e.g., 802-0, 802-1, . . . 802-7). Each register 802 can include a number of fields. For example, field 804 may be a 2-bit wide field to store data representing erase operation algorithms. Also for example, field 806 may be a 2-bit wide field to store data representing program operation algorithms. Also for example, field 808 may be a 2-bit wide field to store data representing retry loops. Other fields (not shown) may be used to indicate option variables to set conditions for the various algorithms. Various fields of registers 502 may generally be used to form or support a conditions table that may be accessed (e.g., by program operation control 706, erase operation control 708, etc.) to set the conditions for one or more of the program and erase operations of a selected operation algorithm. Also, while configuration register 718 is shown as separate from register block 702, in some cases configuration register 718 can be implemented as part of register block 702.

Register block 702 can also include address decoder 816, which can receive signals 810 (e.g., address, address load, etc.) from controller 704, and may provide 3-bit decoded values to address one of eight registers 802. Read/write control 818 can receive signals 812 (e.g., read control signal, write control signal, etc.) from controller 704, and may provide a control signal to data latch 820. Data latch 820 can receive signals 814 (e.g., read data strobe, data out enable, load data, etc.) from controller 704, and may receive or provide the data to/from register block 702. Also, while only eight registers are shown in the particular example of FIG. 8, any suitable number of registers can be accommodated in particular embodiments. For example, 24 registers can be included, where each register is 8-bits wide. In addition, such registers may support other programmable impedance device-based functions, such as word line voltage level, compliance current (e.g., where the cell is programmed until reaching this compliance current, X μA), equalization pulse width, single ended or differential sense amplifier configuration, other status information, as well as any number of other device functions and/or parameters.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of controlling write parameter selection in a non-volatile memory device, the method comprising:
   a) storing a configuration set number in a configuration register, wherein the configuration register is accessible by a user via an interface;
   b) receiving a write command from a host via the interface;
   c) comparing the stored configuration set number against set numbers in a register block to determine a match or a mismatch;
   d) reading configuration bits from a memory array for storing as a configuration set in the register block, and selecting the configuration set from the register block, in response to the mismatch determination;
   e) directly selecting the configuration set corresponding to the stored configuration set number from the register block in response to the match determination; and
   f) using only the selected configuration set in order to determine a write operation algorithm from a group of write operation algorithms comprising to determine a write pulse width and a write current that are used to perform a write operation on the non-volatile memory device in order to execute the write command.

2. The method of claim 1, further comprising:
   a) maintaining the configuration set in the register block after completion of the write operation in response to a first value stored in the configuration register; and
   b) returning the configuration set in the register block to a default state after completion of the write operation in response to a second value stored in the configuration register.

3. The method of claim 1, further comprising:
   a) maintaining the configuration set in the register block after completion of the write operation in response to a first value stored in the configuration register; and
   b) returning the configuration set in the register block to a previous state after completion of the write operation in response to a second value stored in the configuration register.

4. The method of claim 1, wherein the register block comprises fuse bits.

5. The method of claim 1, wherein the selected configuration set is targeted for code writing required to survive surface-mount technology (SMT) processes.

6. The method of claim 1, wherein the selected configuration set is targeted for data writing required to have retention times of at least 10 years.

7. The method of claim 1, wherein the selected configuration set is targeted for data writing required to have write times that are prioritized over retention times.

8. The method of claim 1, wherein the write operation algorithm comprises the write pulse width, a write voltage, and the write current.

9. The method of claim 1, wherein the non-volatile memory device comprises a plurality of resistive memory cells, wherein each of the resistive memory cells is configured to be programmed to a low resistance state by application of a first voltage in a forward bias direction, and to be erased to a high resistance state by application of a second voltage in a reverse bias direction.

10. A non-volatile memory device, comprising:
    a) a configuration register configured to store a configuration set number, wherein the configuration register is accessible by a user via an interface;
    b) a command decoder configured to receive a write command from a host via the interface;
    c) a register block having set numbers that are compared against the stored configuration set number to determine a match or a mismatch;
    d) a memory array coupled to the register block, wherein the memory array comprises a plurality of memory cells that are read to provide configuration bits to store as a configuration set in the register block and that are selected from the register block in response to the mismatch determination, and wherein the configuration set corresponding to the stored configuration set number is directly selected from the register block in response to the match determination; and e) a controller coupled to the register block, wherein the controller comprises a circuit that uses only the selected configuration set from the register block in order to determine a write operation algorithm from a group of write operation algorithms comprising to determine a write pulse width and a write current that are used to perform a write operation on the non-volatile memory device in order to execute the write command.

11. The non-volatile memory device of claim 10, wherein:
a) the controller is configured to maintain the configuration set in the register block after completion of the write operation in response to a first value stored in the configuration register; and
b) the controller is configured to return the configuration set in the register block to a default state after completion of the write operation in response to a second value stored in the configuration register.

12. The non-volatile memory device of claim 10, wherein:
a) the controller is configured to maintain the configuration set in the register block after completion of the write operation in response to a first value stored in the configuration register; and
b) the controller is configured to return the configuration set in the register block to a previous state after completion of the write operation in response to a second value stored in the configuration register.

13. The non-volatile memory device of claim 10, wherein the register block comprises fuse bits.

14. The non-volatile memory device of claim 10, wherein the selected configuration set is targeted for code writing required to survive surface-mount technology (SMT) processes.

15. The non-volatile memory device of claim 10, wherein the selected configuration set is targeted for data writing required to have retention times of at least 10 years.

16. The non-volatile memory device of claim 10, wherein the selected configuration set is targeted for data writing required to have write times that are prioritized over retention times.

17. The non-volatile memory device of claim 10, wherein the write operation algorithm comprises the write pulse width, a write voltage, and the write current.

18. The non-volatile memory device of claim 10, wherein the non-volatile memory device comprises a plurality of resistive memory cells, wherein each of the resistive memory cells is configured to be programmed to a low resistance state by application of a first voltage in a forward bias direction, and to be erased to a high resistance state by application of a second voltage in a reverse bias direction.

19. A memory system, comprising the non-volatile memory device of claim 10, and further comprising a host device configured to control the non-volatile memory device.

20. The memory system of claim 19, wherein the interface comprises a serial peripheral interface (SPI) between the host device and the non-volatile memory device.

* * * * *